United States Patent
Zheng et al.

(10) Patent No.: US 6,794,294 B1
(45) Date of Patent: Sep. 21, 2004

(54) ETCH PROCESS THAT RESISTS NOTCHING AT ELECTRODE BOTTOM

(75) Inventors: Tammy Zheng, Fremont, CA (US); Calvin Todd Gabriel, Cupertino, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/437,006

(22) Filed: Nov. 9, 1999

(51) Int. Cl.$^7$ .............................................. H01L 21/302
(52) U.S. Cl. ........................ 438/706; 438/710; 438/719
(58) Field of Search ................................ 438/706, 710, 438/719, 720

(56) References Cited

U.S. PATENT DOCUMENTS

| | | | | |
|---|---|---|---|---|
| 5,560,804 A | | 10/1996 | Higuchi et al. | |
| 5,627,395 A | * | 5/1997 | Witek et al. | 257/350 |
| 5,783,100 A | * | 7/1998 | Blalock et al. | 216/67 |
| 5,837,428 A | * | 11/1998 | Huang et al. | 430/313 |
| 5,885,902 A | | 3/1999 | Blasingame et al. | |
| 6,081,334 A | * | 6/2000 | Grimbergen et al. | 356/357 |
| 6,187,685 B1 | * | 2/2001 | Hopkins et al. | 438/710 |
| 6,232,184 B1 | * | 5/2001 | Wang et al. | 438/265 |

FOREIGN PATENT DOCUMENTS

| | | |
|---|---|---|
| JP | 04 063 426 | 2/1992 |
| JP | 04 290 430 | 10/1992 |
| JP | 05 121 370 | 5/1993 |

\* cited by examiner

*Primary Examiner*—Kin-Chan Chen
(74) *Attorney, Agent, or Firm*—Peter Zawilski

(57) ABSTRACT

A semiconductor device is manufactured using a small amount of nitrogen in the gate electrode etch process to minimize notching at the bottom of the electrode. Consistent with one embodiment of the present invention, the gate electrode etch process includes using a plasma-etch and selectively etching into the device layer to form the electrode with its lower sidewalls protected using a relatively small percentage of nitrogen in the plasma gas flow.

2 Claims, 2 Drawing Sheets

ETCH PROCESS THAT RESISTS NOTCHING AT ELECTRODE BOTTOM

FIELD OF THE INVENTION

The present invention is directed generally to a semiconductor method of manufacture, and more particularly to such a method involving plasma etching in the formation of electrodes, such as gate electrodes.

BACKGROUND OF THE INVENTION

The electronics industry continues to strive for high-speed, high-functioning circuits. Significant achievements in this regard have been realized through the fabrication of very large-scale integration of circuits on small areas of silicon wafer. Integrated circuits of this type are manufactured through a series of steps carried out in a particular order. The main objective in manufacturing such devices is to obtain a device which conforms to geographical features of a particular design for the device. To obtain this objective, steps in the manufacturing process are closely-controlled to ensure that rigid requirements, for example, exacting tolerances, quality materials, and clean environment, are realized.

Semiconductor devices are used in large numbers to construct most modern electronic devices. To increase the capability of such electronic devices or to decrease the costs per die in a competitive market, larger numbers of such devices are integrated into a single silicon wafer. As the semiconductor devices are scaled down (i.e., made smaller) to address these needs, the structure of the devices and fabrication techniques used to make such devices must be refined to remove contaminants and tighten tolerances on acceptable structural imperfections.

A wide variety of processing techniques may be employed in manufacturing silicon integrated circuit devices, such as chips. In those devices, silicon is employed as a semiconductor for conduction of electricity. The chip manufacturing process typically begins with a silicon wafer substrate. The silicon wafer substrate is formed of single-crystal silicon (Si).

Typical steps in the manufacturing process of a silicon integrated circuit device include growing a layer of silicon dioxide ($SiO_2$, or "oxide") upon the surface of the wafer. Silicon dioxide (or other dielectrics) serves as an insulative material and is often used to separate various semiconducting layers of integrated circuit devices. A variety of methods may be employed to force oxide growth on the wafer, including, for example, thermal oxidation. In thermal oxidation, the silicon reacts with oxygen to form a continuous layer of high-quality silicon dioxide. A film of silicon dioxide can also be formed on the surface of a wafer in other manners. Amorphous or polycrystalline silicon is then deposited on the oxide. For simplicity, these films will be referred to as "polysilicon" here. An organic or inorganic anti-reflective coating (ARC) film may be deposited on top of the polysilicon to improve control of the photolithography process. A variety of techniques, including, for example, photolithography, may be employed to achieve desired wafer surface configurations.

In photolithography, a photoresist material, for example, a photo-sensitive polymer, may be layered atop a somewhat uniform polysilicon or ARC layer on a wafer surface. A mask having a desired design of clear and opaque areas may then be positioned atop the photoresist layer. A resulting characteristic of photoresist response to UV light permits the photoresist to be selectively subjected to UV light and then developed to leave behind an image that will serve as a mask for forming particular patterns of photoresist material atop the polysilicon or ARC. Once a particular pattern of photoresist is formed atop the polysilicon or ARC of a wafer, portions of the wafer topped by polysilicon or ARC but not topped by photoresist may then be etched away from the wafer surface.

Etching is a common procedure employed in manufacture of silicon integrated circuit devices. In general terms, etching is a process by which portions of the wafer surface may be selectively removed from the wafer. The etch process yields a layer on the wafer surface having a desired geographical arrangement for further processing. After the etch, the photoresist is removed by a subsequent processing step, leaving the silicon wafer topped only by select configurations of polysilicon or ARC.

The general silicon dioxide/polysilicon/ARC/photoresist/etch method described above is often used in the formation of the gate electrode portion of a transistor. Such gate electrode formation involves layering an oxide, followed by a conductive polysilicon layer, over the underlying (typically doped) silicon used to form the active and isolation regions. The portions of the conductive polysilicon layer designated to form the resultant gate electrodes are hardmasked, for example, using SiON. Gate electrodes are then formed by selectively etching the conductive polysilicon in such a manner that trenches are formed between adjacent gate electrodes. Selectively etching in this context refers to etching the unmasked material, thereby providing a trench with substantially vertical sidewalls.

The ideal selective etching process would provide perfectly vertical sidewalls that provide an interface at the trench bottom which is normal. In practice, however, process changes made to increase silicon-to-oxide selectivity result in notching at the bottom of the gate electrode. FIG. 1 illustrates this notching effect at the bottom of the pillar-like electrode structures.

In modern semiconductor applications, the thickness of the underlying layer of gate oxide has been reduced to about 30 Å for 0.15 micron and similar technologies. In the future, the gate oxide layer will be thinned further, perhaps to as little as 15–20 Å. Due to the notching problem described above, the plasma etch process conventionally used to define the gate electrode inevitably consumes some of this oxide; consequently, process changes are made to boost silicon-to-oxide selectivity to minimize the loss. In the prior art, changes such as reducing bias power have been found to be useful for improving selectivity, but with the disadvantage of lateral etching beginning to occur as the sidewall protection of the gate electrode is diminished. This lateral etching typically appears as a notch at the gate/oxide interface.

Accordingly, there is a need to improve the process of forming the gate electrode in a manner that overcomes the aforementioned deficiencies.

SUMMARY OF THE INVENTION

Generally, the present invention relates to a semiconductor device manufactured using a more accurate gate-electrode formation process. Consistent with the present invention, a semiconductor device is formed as part of a wafer having an upper surface, with at least one device layer over the upper surface of the wafer. The device layer is formed using a silicon-to-oxide selectivity during gate etch to improve sidewall protection and to eliminate notching at the bottom of the gate electrode. In connection with the one embodiment of the present invention, it has been discovered that adding a small amount of nitrogen during the endpoint step prevents the notch without affecting selectivity. A more specific embodiment of the present invention provides a method for improving sidewall protection and preventing notch formation without affecting silicon:oxide selectivity. During the endpoint step, a small amount of nitrogen is added to the conventional polysilicon etch chemistry.

In accordance with another embodiment of the present invention, a process of forming a semiconductor device, includes: forming at least one device layer over a wafer surface; providing a mask over a portion of the device layer; using a plasma-etch and selective etching into the device layer to form a pillar structure having at least one sidewall, the selective etching includes the use of nitrogen as part of the plasma etch.

Yet another embodiment of the present invention is directed to a process of forming a semiconductor device, comprising: forming at least one device layer over an underlying dielectric layer, the device layer and the underlying dielectric layer being over a wafer surface, providing a mask over a portion of the device layer; a step of using a plasma-etch of a first chemistry and selectively etching into the device layer for a function of forming a pillar structure having at least one sidewall. After the step of using the first chemistry, using a step of using a plasma-etch of a different second chemistry that includes less than about ten percent nitrogen of gas flow in the second chemistry for a function of completing the selective etching upon etching up to the underlying dielectric layer. In another embodiment, the second chemistry includes less than about five percent of the gas flow.

In another embodiment, a process of forming a semiconductor device includes forming at least one gate electrode layer over a gate oxide; providing a hardmask over a portion of the device layer; using a plasma-etch of a first chemistry that includes HBr and selectively etching into the device layer to form a pillar structure having at least one sidewall. After using the first chemistry, a plasma-etch of a different second chemistry that includes HBr and nitrogen and selectively etching into the device layer to form a pillar structure having at least one sidewall is used. The second chemistry includes using nitrogen in an amount less than about ten percent of gas flow of the second chemistry and terminating the use of a plasma-etch of the second chemistry in response to reaching the gate oxide. The first chemistry can include $HBr/Cl_2$, $HBr/HCl$, or $HBr/Cl_2/Cl_4$ for etching through the polysilicon, and can also include a selectivity booster such as $He—O_2$.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
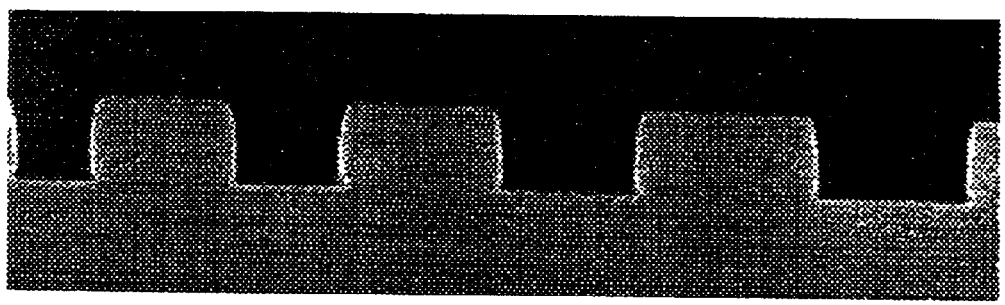
FIG. 1 illustrates an actual cross-sectional view of a conventional semiconductor device in which gate electrode lines illustrate the notching issue addressed by the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF VARIOUS EMBODIMENTS

The present invention is believed to be applicable to a number of semiconductor devices which are manufactured using an electrode etching process. The invention has been found to be particularly advantageous in application environments where it is desirable to form gate electrodes over gate oxide layers that are relatively thin, for example, less than about 50 Å, and in other applications, less than about 30 Å. For further reductions in thickness of the gate oxide layer, the recognizable contributions in using various embodiments of the present invention increase significantly. While the present invention is not necessarily limited to any particular applications of this type, an appreciation of various aspects of the invention is best gained through a discussion of various application examples of processes used to form such semiconductor devices.

Generally, the exemplary processes discussed below illustrate a variety of techniques for forming a semiconductor device in which a polysilicon gate electrode is formed over a thin underlying dielectric layer, such as a gate oxide, using a plasma etch process that significantly retards notching as the plasma etch approaches the endpoint, i.e., the thin underlying dielectric layer. According to one embodiment, a plasma etching process used to form the gate electrode includes includes a plasma containing a selected amount of nitrogen in the overall gas flow to provide a desired retardation of notching near the thin underlying dielectric layer.

Figure 2:
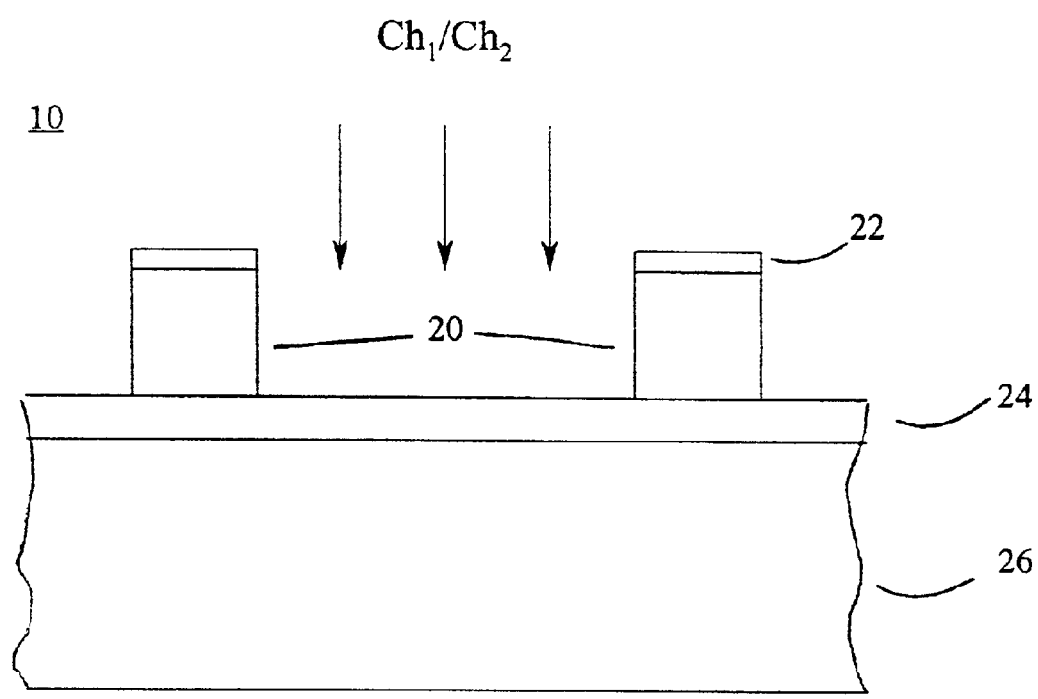
FIG. 2 illustrates a cross-sectional sketch of a semiconductor device in which gate electrode lines are formed in accordance with an example embodiment of the present invention.

Referring to FIG. 2, a cross-sectional view of a portion of a semiconductor device 10 shows polysilicon gate electrodes at lines 20 between an overlying hardmask 22 and an underlying dielectric layer 24 such as an oxide. The dielectric layer 24 resides over a silicon wafer region 26 that is used in forming the source/drain and channel regions (not shown) of the transistors including the gate electrodes 20. The gap between the gate electrodes 20 is a trench formed using a plasma etch chemistry that provides little if any notching at the trench bottom.

In one particular example application, two different plasma chemistries are used to retard the notching effect at the bottom of the trench. The first chemistry is a conventional chemistry for selectively etching into the gate electrode material and not into the mask atop the gate electrode material. For example, using a hardmask such as SiON, the first chemistry can include $HBr/Cl_2$, $HBr/HCl$, or $HBr/Cl_2/Cl_4$, for selectively etching a polysilicon electrode material. The first chemistry can also include a selectivity booster such as $He—O_2$. After using the first chemistry and sometime before reaching the underlying gate oxide, the chemistry is changed to one that includes a small amount of nitrogen, e.g., less than about twelve to fifteen percent of gas flow in the second chemistry depending on the application.

This second chemistry is used to complete the selective etching, with an endpoint detection process or other technique used to terminate this nitrogren-modified plasma etch. By adding such an amount of nitrogen before the endpoint termination, the notching effect such as shown in FIG. 1 is avoided without affecting the selectivity of the overall etching process.

In another particular example application, the same plasma chemistry is used in the trenching to form the electrode pillar, wherein the benefit of the added nitrogen to retard the notching effect at the bottom of the trench is realized when the etching approaches the underlying electrode dielectric. Any of the so-called second chemistries, discussed herein, can be used in this process.

Accordingly, an important aspect of the present invention is the use of a small amount of nitrogen in completing the plasma etching for formation of the gate electrode. In one embodiment, this plasma etching includes using less than about ten percent of nitrogen in the plasma chemistry when etching near the underlying electrode dielectric. For other applications, this amount of nitrogen can vary depending upon the desired need for retarding the notching effect and/or minimizing any adverse effect on overall selectivity.

Figure 3:
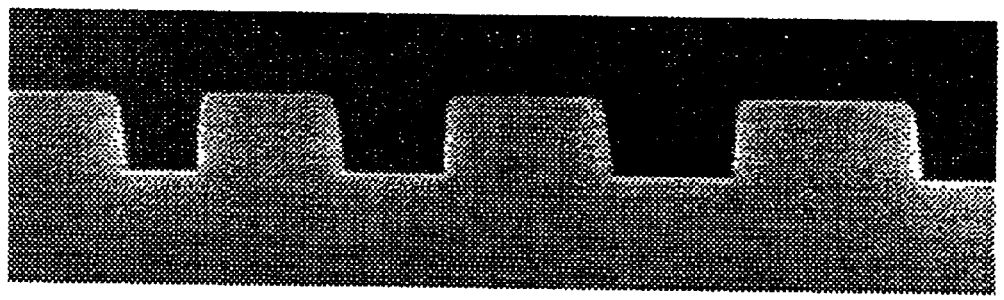
FIG. 3 illustrates an actual cross-sectional view of a semiconductor device in which gate electrode lines are formed in accordance with an example embodiment of the present invention.

FIG. 3 illustrates an actual cross-sectional view of a semiconductor device in which gate electrode lines are formed, according to an example embodiment of the present invention, using nitrogen in an amount of about two percent (specifically, 1.7 percent) of the total plasma gas flow. In this example embodiment, the silicon etching tool being used is a Lam Research Corp. TCP 9400SE silicon etch tool, and using SiON as a hardmask atop the portions of the polysilicon to be used in forming the pillar electrode structures. For reliable control of such low flow rates, rather than using a pure $N_2$ as the nitrogren additive, a diluted gas mixture such as 80% helium/20% nitrogen (He—$N_2$), may be advantageous.

The amorphous silicon and thermal oxide etch rates and selectivities with and without nitrogen are shown below in Table I using photoresist-patterned wafers for measurements. Nitrogen addition has a small impact with the difference (e.g., 5% or less) well within the measurement error, and on hardmasked wafers, the oxide etch rate is so low that it is not measurable, giving nearly infinite selectivity.

TABLE I

Etch rate and selectivity measurements.

|  | No $N_2$ added | With 20 sccm $N_2$ | Delta (%) |
|---|---|---|---|
| Amorphous silicon etch rate (Å/sec) | 17.9 | 18.1 | −1% |
| Thermal oxide etch rate (Å/sec) | 0.44 | 0.46 | −5% |
| Silicon:oxide selectivity | 40.7 | 39.3 | 3% |

The following Table II exemplifies an acceptable chemistry for achieving the formation of the electrode structure illustrated in FIG. 3:

| Hard mask gate etching with N2 addition at end point step | | | | | | | | |
|---|---|---|---|---|---|---|---|---|
|  | Step 01 | Breakthrough Step 02 | Step 03 | Bulk Endpoint Step 04 | Step 05 | Over Etch Step 06 | Step 07 | Step 08 |
| Pressure (mT) | 10.00 | 10.00 | 20.00 | 20.00 | 80.00 | 80.00 | 90.00 | 0.00 |
| RF — Top (W) | 0.0 | 350.0 | 0.0 | 150.0 | 0.0 | 250.0 | 0.0 | 0.0 |
| RF — Bottom (W) | 0.0 | 50.0 | 0.0 | 30.0 | 0.0 | 70.0 | 0.0 | 0.0 |
| Gap (cm) | 8.100 | 8.100 | 8.100 | 8.100 | 8.100 | 8.100 | 8.100 | 8.100 |
| Cl2 (sccm) | 0.0 | 0.0 | 10.0 | 10.0 | 0.0 | 0.0 | 0.0 | 0.0 |
| HBr (sccm) | 0.0 | 0.0 | 150.0 | 150.0 | 200.0 | 200.0 | 0.0 | 0.0 |
| 80%He—O2 (sccm) | 0.0 | 0.0 | 15.0 | 15.0 | 10.0 | 10.0 | 0.0 | 0.0 |
| CF4 (sccm) | 100.0 | 100.0 | 0.0 | 0.0 | 0.0 | 0.0 | 0.0 | 0.0 |
| He (sccm) | 0.0 | 0.0 | 0.0 | 0.0 | 200.0 | 200.0 | 200.0 | 0.0 |
| N2 (sccm) | 0.0 | 0.0 | 3.0 | 3.0 | 0.0 | 0.0 | 0.0 | 0.0 |
| He damp (T) | 8.0 | 8.0 | 8.0 | 8.0 | 8.0 | 8.0 | 0.0 | 0.0 |
| Completion | Stabl | Time | Stabl | EndPt | Stabl | Time | Time | End |
| Time | 30 | 8 | 30 | 150 | 30 | 60 | 7 | |
| Channel | | | | A | | | | |
| Delay (sec) | | | | 40 | | | | |
| Norm (sec) | | | | 1 | | | | |
| Trigger (%) | | | | 99 | | | | |

| Temperatures | (° C.) |
|---|---|
| Bottom Electrode | 65.0 |
| Chamber | 60.0 |

| Channel | Wavelength (nm) |
|---|---|
| A | 405 |
| B | 520 |

| MFC | Gas | sccm |
|---|---|---|
| 1 | Cl2 | 200 |
| 2 | HBr | 200 |
| 3 | 80%He—O2 | 20 |
| 4 | CF4 | 200 |

| | -continued | |
|---|---|---|
| 5 | He | 200 |
| 6 | SF6 | 100 |
| 7 | O2 | 100 |
| 8 | N2 | 50 |

The present invention is applicable to fabrication of various types of electrodes having an underlying thin dielectric layer that reacts to the nitrogen plasma additive in the same manner as oxide. The present invention should not be considered limited to the particular examples described above, but rather should be understood to cover all aspects of the invention as fairly set out in the attached claims. Various modifications, as well as numerous structures to which the present invention may be applicable, will be readily apparent to those of skill in the art upon review of the present specification. The claims are intended to cover such modifications and devices.

What is claimed is:

1. A process of forming a semiconductor device, comprising:

forming at least one gate electrode layer over a gate oxide, the gate oxide being above a wafer surface;

providing a hardmask over a portion of the device layer;

using a plasma-etch of a first chemistry that includes one of $HBr/Cl_2$, $HBr/HCl$, or $HBr/Cl_2/Cl_4$, and also includes a selelivity booster, and selectively etching into the device layer to form a pillar structure having at least one sidewall;

after using the first chemistry, using a plasma-etch of a different second chemistry that includes HBr and nitrogen and selectively etching into the device layer to form a pillar structure having at least one sidewall, the second chemistry including nitrogen in an amount less than about ten percent of gas flow of the second chemistry, wherein the amount of nitrogen is maintained to minimize notching in the pillar structure without affecting selectivity; and terminating the use of a plasma-etch of the second chemistry in response to reaching the gate oxide.

2. A process, according to claim 1, wherein the first chemistry includes $HBr/Cl_2$ and $He-O_2$.

* * * * *